US009349812B2

(12) United States Patent
Chen et al.

(10) Patent No.: US 9,349,812 B2
(45) Date of Patent: May 24, 2016

(54) SEMICONDUCTOR DEVICE WITH SELF-ALIGNED CONTACT AND METHOD OF MANUFACTURING THE SAME

(71) Applicant: UNITED MICROELECTRONICS CORP., Hsin-Chu (TW)

(72) Inventors: Chieh-Te Chen, Kaohsiung (TW); Feng-Yi Chang, Tainan (TW); Hsuan-Hsu Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 55 days.

(21) Appl. No.: 13/902,975

(22) Filed: May 27, 2013

(65) Prior Publication Data
US 2014/0346575 A1 Nov. 27, 2014

(51) Int. Cl.
*H01L 29/417* (2006.01)
*H01L 29/06* (2006.01)
*H01L 21/311* (2006.01)
*H01L 21/768* (2006.01)
*H01L 23/485* (2006.01)
*H01L 29/66* (2006.01)

(52) U.S. Cl.
CPC .... *H01L 29/41775* (2013.01); *H01L 21/31144* (2013.01); *H01L 21/76816* (2013.01); *H01L 21/76897* (2013.01); *H01L 23/485* (2013.01); *H01L 29/0692* (2013.01); *H01L 29/66545* (2013.01); *H01L 2924/0002* (2013.01)

(58) Field of Classification Search
CPC .................. H01L 21/76897; H01L 29/41775; H01L 21/41783
USPC .................................................. 438/584–688
See application file for complete search history.

(56) References Cited

U.S. PATENT DOCUMENTS

| | | | |
|---|---|---|---|
| 6,855,607 B2 | 2/2005 | Achuthan | |
| 7,013,446 B2 | 3/2006 | Ohba | |
| 7,112,495 B2 | 9/2006 | Ko | |
| 7,250,658 B2 | 7/2007 | Doris | |
| 7,521,324 B2 | 4/2009 | Ohmi | |
| 7,531,437 B2 | 5/2009 | Brask | |
| 7,592,270 B2 | 9/2009 | Teo | |
| 2002/0012876 A1* | 1/2002 | Angelopoulos et al. ... | 430/271.1 |
| 2005/0062161 A1* | 3/2005 | Chen et al. ..................... | 257/758 |
| 2007/0015365 A1 | 1/2007 | Chen | |
| 2007/0072376 A1 | 3/2007 | Chen | |
| 2007/0218661 A1 | 9/2007 | Shroff | |
| 2008/0061366 A1 | 3/2008 | Liu | |
| 2008/0076244 A1* | 3/2008 | Ye et al. ........................ | 438/597 |
| 2009/0057759 A1 | 3/2009 | Obradovic | |
| 2009/0075472 A1* | 3/2009 | Arnold et al. ................. | 438/623 |
| 2009/0124097 A1 | 5/2009 | Cheng | |

(Continued)

*Primary Examiner* — Tucker J Wright
*Assistant Examiner* — Mark Hatzilambrou
(74) *Attorney, Agent, or Firm* — Winston Hsu; Scott Margo

(57) ABSTRACT

A semiconductor device with a self-aligned contact and a method of manufacturing the same, wherein the method comprises the step of forming a 1st dielectric layer on gate structures, form a self-aligned contact trench between two gate structures, forming an 2nd dielectric layer on the 1st dielectric layer and in the self-aligned contact trench; patterning the 2nd dielectric layer into a 1st portion on the 1st dielectric layer and a 2nd portion filling in the self-aligned contact trench, using the 2nd dielectric layer as a mask to etch the 1st dielectric layer, and forming a metal layer and a self-aligned contact simultaneously in the 1st dielectric layer and in the self-aligned contact trench.

9 Claims, 5 Drawing Sheets

(56) References Cited

U.S. PATENT DOCUMENTS

| | | |
|---|---|---|
| 2009/0200494 A1 | 8/2009 | Hatem |
| 2010/0044783 A1 | 2/2010 | Chuang |
| 2010/0048027 A1 | 2/2010 | Cheng |
| 2010/0129994 A1 | 5/2010 | Awad |
| 2010/0283152 A1 | 11/2010 | Chen |
| 2014/0264483 A1* | 9/2014 | Yoshida et al. ............... 257/288 |

* cited by examiner

SEMICONDUCTOR DEVICE WITH SELF-ALIGNED CONTACT AND METHOD OF MANUFACTURING THE SAME

BACKGROUND OF THE INVENTION

1. Field of the Invention

The present invention relates generally to a semiconductor device and a method of manufacturing the same, more particularly, to a semiconductor device with self-aligned contacts and a method of manufacturing the same.

2. Description of the Prior Art

The semiconductor industry has always strived to achieve smaller feature sizes. For example, the size of transistors such as planar transistors has steadily decreased through advances in process development and the need to increase feature density. Current scaling employs 28 nm technologies with development also progressing towards 20 nm and beyond technologies (e.g., 14 nm technologies). Moreover, replacement gate process flows are developed and becoming more commonly utilized as they can avoid certain problems found in gate first processes. For example, replacement metal gate (RMG) processes may avoid problems associated with the stability of the work function material used in the gates.

Most contact processes would suffer from alignment issues when making trench contacts and/or local interconnect connections to the gate. Conventional contact processes are not self-aligned and can easily fail from misalignment during processing. It may also be difficult to pattern bidirectional local interconnect and/or reduce the number of interface layers from the local interconnect to either the gate or the source/drain of the gate.

Moreover, forming reliable contact structures for semiconductor devices would become more difficult as feature sizes have decreased and device densities on a chip have increased. For example, the aspect ratio (ratio of depth to width) of contact structures increases as device density increases. As a result, it is becoming increasingly difficult to perform contact etching to a required depth without over-etching in a lateral direction.

To solve some of above-mentioned misalignment and over-etching issues, process flows have been made that attempt to create a self-aligned trench contact that extends above the gate to allow less complex local interconnect flow. Self-aligned production methods make it possible to meet the requirements for smaller structures while at the same time fulfilling tolerance ranges to be complied with.

Such self-aligned contact process flows, however, are typically very complex, have many resistive interfaces, and have high manufacturing costs due to the complex process flow. Additionally, there is a low manufacturing margin for misalignments or other errors due to the complexity of the processes as these processes may have severely restrictive design and/or alignment rules. Thus, there is a need for a method to self-align trench contacts to the sources/drains and extend the trench contacts above the gates.

SUMMARY OF THE INVENTION

To simplify the conventional and complex method of manufacturing a self-aligned contact, a novel method is, therefore, provided in present invention with feature of forming the self-aligned contact and underlying metal layer (M0 layer) in the same process flow.

One object of the present invention is to provide a method of manufacturing a semiconductor device with a self-aligned contact, the method comprises the steps of: providing a substrate with a plurality of gate structures formed thereon; forming a 1st dielectric layer on the gate structures and the substrate; patterning the 1st dielectric layer to open a self-aligned contact trench between two gate structures; forming a 2nd dielectric layer on the 1st dielectric layer and in the self-aligned contact trench; patterning the 2nd dielectric layer into a 1st portion defining a pattern of metal layer on the 1st dielectric layer and a 2nd portion filling in the self-aligned contact trench and positioning under a part of the pattern of metal layer; performing an etch process with the 1st portion and the 2nd portion of 2nd dielectric layer served as an etch mask to form the pattern of metal layer in the 1st dielectric layer; removing remained 2nd dielectric layer; and forming a metal layer simultaneously in the self-aligned contact trench between two gate structures and in the pattern of metal layer in the 1st dielectric layer.

Another object of the present invention is to provide a semiconductor device with a self-aligned contact, wherein the semiconductor device comprises: a substrate with gate structures formed thereon and a source/drain region formed in the substrate between two gate structures; a pre-metal dielectric layer on the gate structures and the substrate; and a metal layer formed in the pre-metal dielectric layer, wherein the metal layer comprises a self-aligned contact extending and electrically connecting to the source/drain region between two gate structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
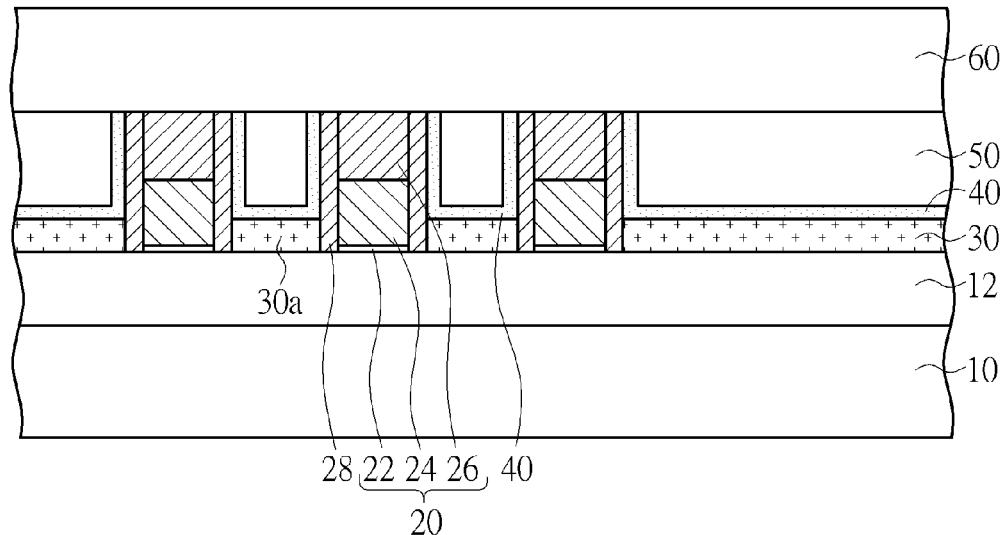
FIGS. 1-9 are cross-sectional views sequentially and schematically illustrating a semiconductor device in the process flow of forming a self-aligned contact in accordance with one embodiment of present invention.

It should be noted that all the figures are diagrammatic. Relative dimensions and proportions of parts of the drawings have been shown exaggerated or reduced in size, for the sake of clarity and convenience in the drawings. The same reference numerals are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The embodiments will now be explained with reference to the accompanying drawings to provide a better understanding of the process of the present invention. Those figures illustrate sequentially and schematically the cross-sectional views of a semiconductor device in the process flow of forming a self-aligned contact in accordance with one embodiment of present invention.

First, as shown in FIG. 1, a substrate 10 is provided to serve as the base of the whole semiconductor device. In present invention, the substrate 10 may be, but not limited to, a silicon substrate, an epitaxial silicon substrate, a silicon germanium (SiGe) substrate, a silicon carbide (SiC) substrate, or a silicon-on-insulator substrate, etc. The substrate 10 may be provided with predetermined NMOS regions and PMOS regions (not shown) and corresponding P-wells and N-wells (not shown). Specifically, in this embodiment with non-planar or 3D transistor scheme, such as a fin field-effect transistor (FinFET) or a tri-gate MOSFET, a plurality of protruding and parallel fin structures 12 may be formed on the substrate 10 to define the profile of 3D gate structures, wherein the fin structures 12 are isolated from each other by shallow trench isolations (STI, not shown) formed therebetween.

Refer again to FIG. 1, a plurality of gate structures 20 are formed on the fin structure 12 of the substrate 10, wherein the gate structure 20 may include sequentially a gate dielectric layer (ex. $SiO_2$) 22, a gate electrode 24 (ex. poly-Si), and a hard mask 26 (ex. SiN or $SiO_2$). Spacers 28 (ex. SiN) are disposed on both sidewalls of the gate structure 20 with a liner layer (not shown) being optionally formed between the spacer 28 and the gate structure 20.

The forming methods of gate structure 20 are well-known in the art, and are not described herein for simplicity of the specification. It should be noted that, the manufacturing method of present invention may combine with advanced replace metal gate (RMG) process. That is, the gate electrode 24 and the gate dielectric layer 22 may be formed of metal material and high-k material respectively. The metal material may be selected from the materials with low resistivity and superior gap-filling characteristics, such as Al, W, Cu, TiAl, or titanium aluminum oxide (TiAlO), but not limited to this. The high-k material may be high-K materials with dielectric constant larger than 4, such as rare earth metal oxides or lanthanide series metal oxides. The material may be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_1$-$xO_3$, PZT), and barium strontium titanate ($Ba_xSr_1$-$xTiO_3$, BST). Additionally, a work function metal layer (not shown) may be formed around the gate electrode 24 to adjust the electrical property of the metal gate structure 20.

Refer again to FIG. 1, after the formation of the gate structure 20, a selective epitaxy process may be performed to form epitaxial layer 30 on the fin structure 12 of substrate 10. The function of epitaxial layer 30 is to increase the volume and the surface area of fin structures 12, so that the self-aligned contacts formed in later processes can more easily land on the surface of the epitaxial layer 30, especially land on a source/drain regions 30a of the epitaxial layer 30 preformed between the gate structure 20 by an ion implantation process. The material of epitaxial layer 30 may include silicon germanium (SiGe), silicon carbide (SiC), a combination thereof, or other III-V compounds, depending on the type of multi-gate FET (such as PMOS or NMOS). A contact etch stop layer (CESL) 40 is grown conformally on the gate structure 20 and the epitaxial layer 30 to serve as a stop layer in following etching process for forming a contact trench.

Refer again to FIG. 1, an interlayer dielectric layer (ILD, such as $SiO_2$ layer) 50 is deposited on the whole substrate 10, including the gate structure 20 and the fin structures 12. Moreover, a pre-metal dielectric layer (PMD, such as $SiO_2$ layer) 60 is further deposited on the gate structure 20 and the ILD layer 50 after performing a planarization process to the substrate for leveling the gate structure 20 and the ILD layer 50 thereon. In present invention, the ILD layer 50 and the PMD layer 50 may be considered as the same dielectric structure or may be formed in the same deposition process.

Figure 2:
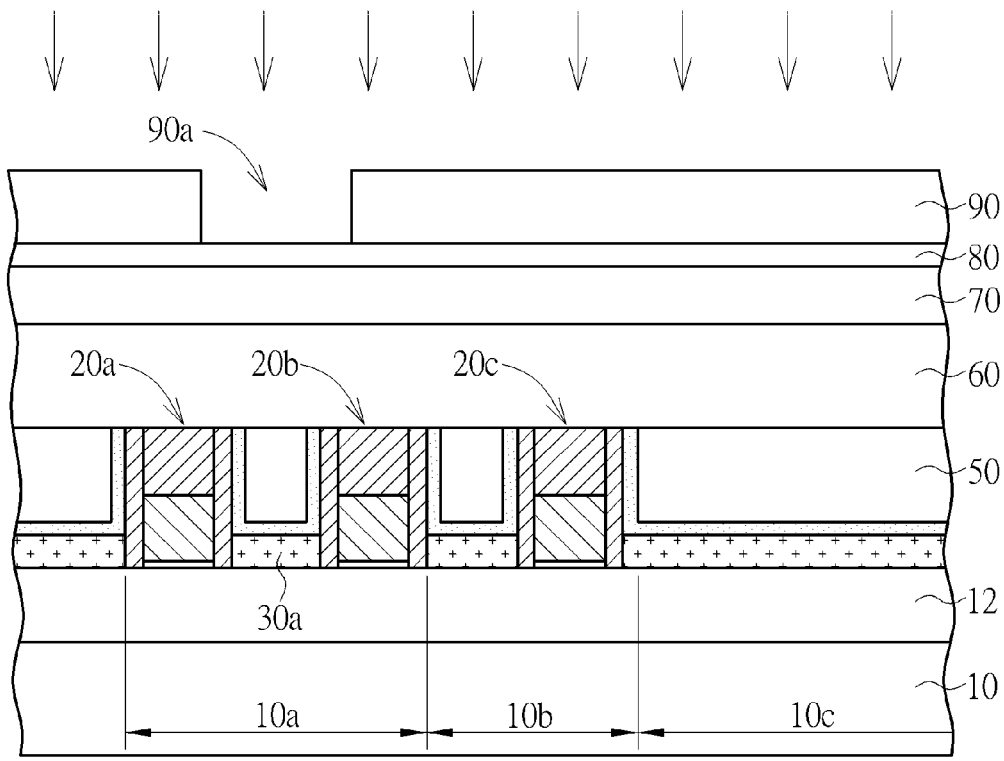

In order to provide clear and proper description for better understanding the embodiment of present invention, please refer to FIG. 2, the substrate 10 is divided schematically into a contact region 10a, a non-contact region 10b, and an isolation region 10c, wherein the contact region 10a is a predetermined region for landing a self-aligned contact, the non-contact region 10b is a region not for contact landing, while the peripheral isolation region 10c is a region without the layout of gate structure 20 or any other semiconductor devices. As shown in FIG. 2, an organic dielectric layer (ODL) 70, a silicon-containing hard mask bottom anti-reflective coating (SHB) 80, and a patterned photoresist layer (PR) 90 are sequential formed on the PMD layer 60. In present invention, the ODL layer 70, SHB layer 80 and PR layer 90 are considered as a multilayer mask structure to be used in photolithographic processes and dry plasma etching processes for forming a feature with reduced critical dimension (CD) in advanced semiconductor process.

In the embodiment, the PR layer 90 may be formed of radiation-sensitive material comprising 248 nm (nanometer) resists, 193 nm resists, 157 nm resists, EUV (extreme ultraviolet) resists, or electron beam sensitive resist. The PR layer 90 may be formed using a track system. For example, the track system can comprise a Clean Track ACT 8, ACT 12, or Lithius resist coating and developing system commercially available from Tokyo Electron Limited (TEL). Other systems and methods for forming the PR layer 90 on the substrate 10 are well known to those skilled in the art of spin-on resist technology. The SHB layer 80 is a silicon-containing anti-reflective coating, for example, a silicon-containing ARC commercially available as Sepr-Shb Aseries SiARC from Shin Etsu Chemical Co., Ltd. The SHB 80 may, for example, be applied using spin coating technology, or a vapor deposition process. The ODL layer 70 may be a photo-sensitive organic polymer or an etch type organic compound, such as polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

Figure 3:
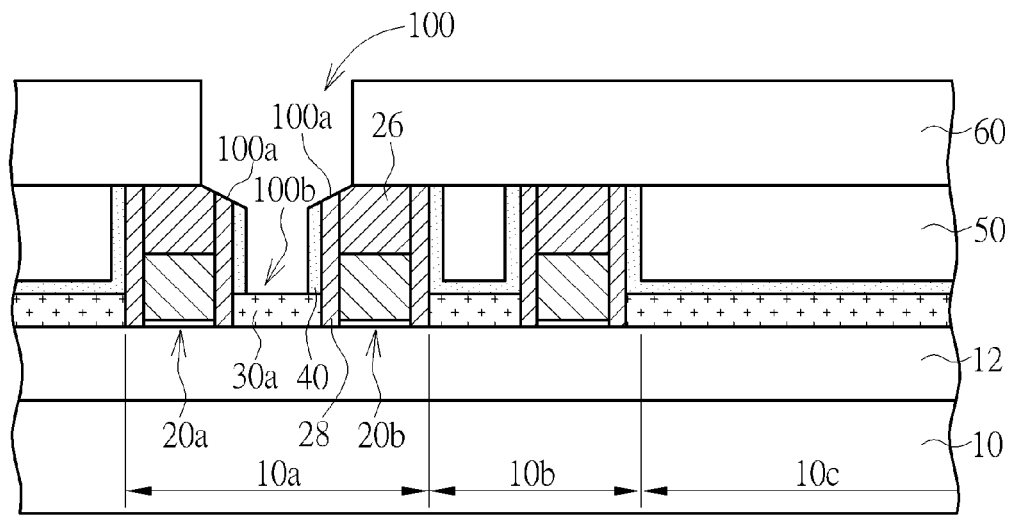

Please refer again to FIG. 2, an opening 90a defining a pattern of a metal layer (ex. M0 layer) is formed in the PR layer 90 by a photolithography process. More specifically, the opening 90a is formed above the contact region 10a of the substrate 10, and preferably, right above the source/drain region 30a between the two gate structures 20a and 20b. The patterned PR layer 90 with the opening 90a and the SHB layer 80 and ODL layer 90 are used as an etch mask in following etch process to open a self-aligned contact trench 100 in the PMD layer 60 and between the two gate structures 20a and 20b, as shown in FIG. 3. This etch process, refer hereinafter as 1st etch process, removes the ILD layer 50 between the two gate structures 20a in the contact region 10a.

In the embodiment of present invention, the process of opening the contact trench 100 is "self-aligned" by defining the opening 90a (FIG. 2) of PR layer 90a in the position between the two gate structure 20a and 20b. As shown in FIG.

3, the spacer 28 and CESL layer 40 may serve as an etch stop layer in 1st etch process to ensure that the opening 100 is right aligned and formed on the desired position, i.e. the position 100b right between the two gate structure 20a and 20b. The CESL layer 40 on the position 100b may be removed in this process. Inclined planes 100a are formed on the sidewalls of both gate structure 20a and 20b due to the different etch rate of the spacer 28 and CESL layer 40 in the 1st etch process. The 1st etch process for selectively etching the PMD layer 60 may only consume a bit amount of the hard mask 26, the spacer 28, and the CESL layer 40 without substantial damage. After the 1st etch process, the ODL layer 70, the SHB layer 80, and the PR layer 90 (FIG. 2) are removed by an ashing process.

Figure 4:
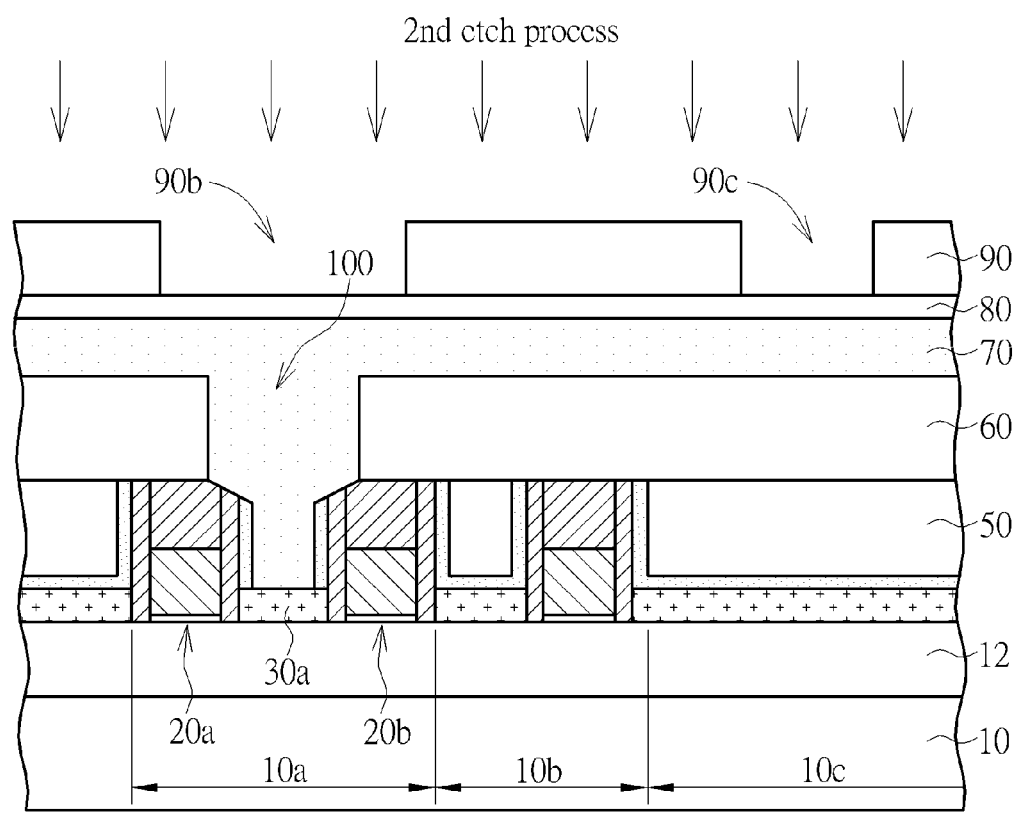

After opening the self-aligned contact trench 100, please refer now to FIG. 4, coating again a multilayer mask structure similar to the one shown in FIG. 2 on the substrate 10, wherein the ODL layer 70 in FIG. 4 not only covers the PMD layer 60, but also fills up the underlying contact trench 100. Similarly, an opening (or trench) 90b of patterned PR layer 90 is formed above the contact region 10a of the substrate 10, and preferably, right above the source/drain region 30a between the two gate structures 20a and 20b, and an additional opening 90c is formed above the isolation region 10c of the substrate 10. However, in comparison to the opening 90a shown in FIG. 2, the opening 90b is generally larger than the opening 90a. This is because the openings 90b and 90c in the embodiment of present invention are used to define the pattern of one of the metal layers, such as M0 layer, overlying the PMD layer 50 and electrically connecting the source/drain region 30a in the substrate 20 via the self-aligned contact. Accordingly, as shown in FIG. 4, the opening 90b is designed to be larger and overlay the self-aligned contact trench 100 to ensure that the M0 layer formed in following deposition process may completely connect with the self-aligned contact without any hangover or loss issue.

Figure 5:
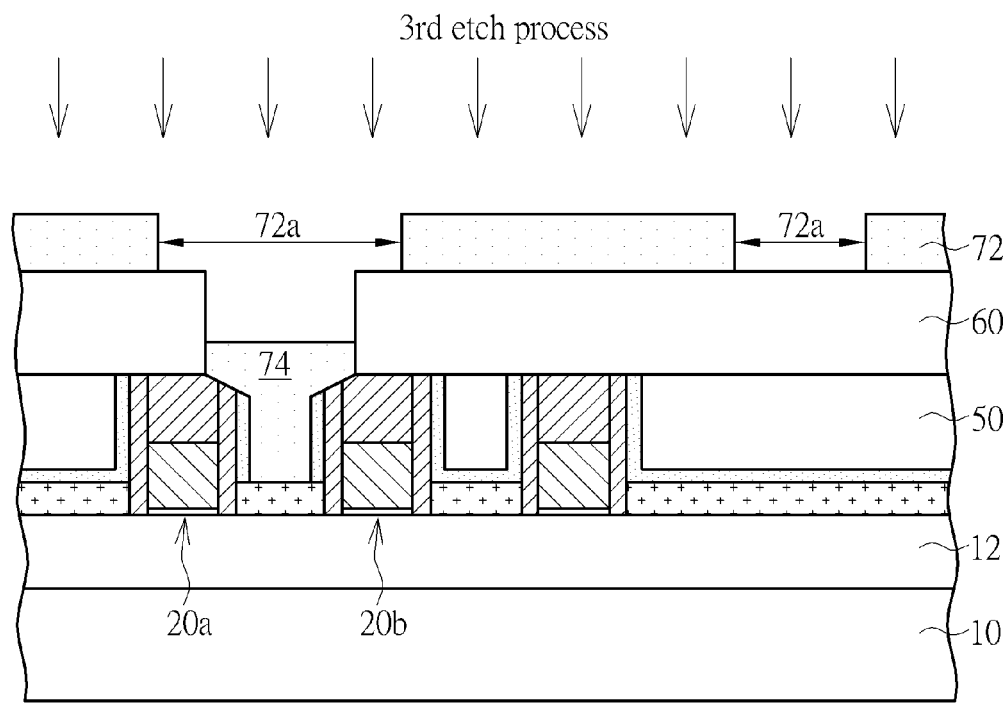

After coating the new multilayer mask structure, please refer now to FIG. 5, a 2nd etch process is performed to pattern the ODL layer 70 underlying the patterned PR layer 90. Due to the 2nd etch process, the ODL layer 70 is patterned into two portions, one is 1st portion 72 formed on the PMD layer 60 with an opening 72a defining the pattern of predetermined metal layer (M0), the other portion is 2nd portion 74 filling up the lower portion of the contact trench 100. Please notes that, in the embodiment of present invention, the 2nd etch process defines the pattern of M0 layer without completely etch off the ODL layer in the opening 72a. The remained ODL layer constructs the mask-like 2nd portion 74 of ODL layer 70 in the trench to protect the underlying components of gate structure 20a and 20b, such as the source/drain region 30a, from being damaged by following etch process. Similarly, the remained PR layer 90 and SHB layer 80 (FIG. 4) on the patterned ODL layer 70 are removed after the 2nd etch process.

Figure 6:
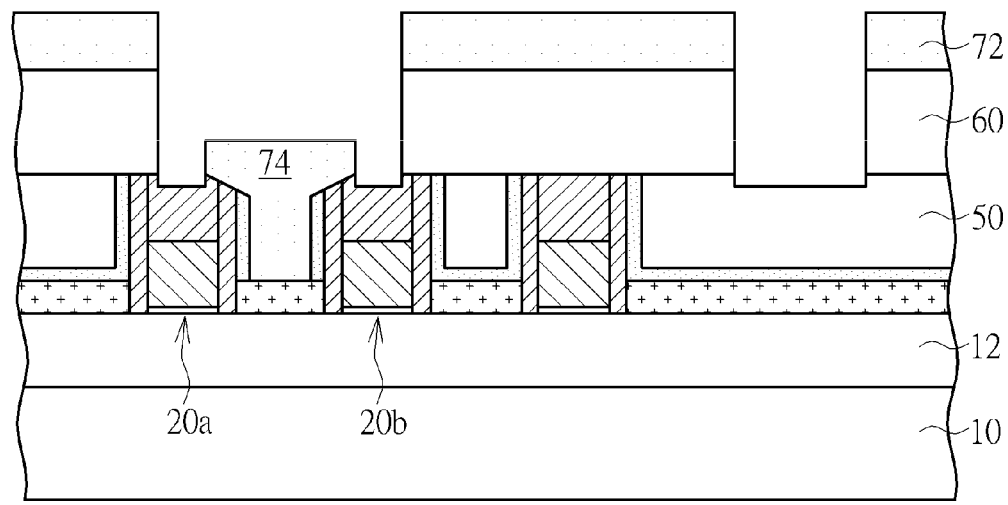

After patterning the ODL layer 70 into the 1st portion 72 and the 2nd portion 74, please refer now to FIG. 6, a 3rd etch process for selectively etching the PMD layer 60 is performed with the 1st portion 72 and the 2nd portion 74 of the ODL layer served as an etch mask. As shown in FIG. 6, the PMD layer 60 exposed from the 1st portion 72 (FIG. 5) is removed in the 3rd etch process to form a desire M0 pattern in the PMD layer 60. The 3rd etch process for selectively etching the PMD layer 60 may also consume a bit amount of the hard mask 26 of gate structure 20a and 20b and the ILD layer 50 in the isolation region 10c of the substrate 10 without cause substantial damage to the gate structure and underlying components.

Figure 7:
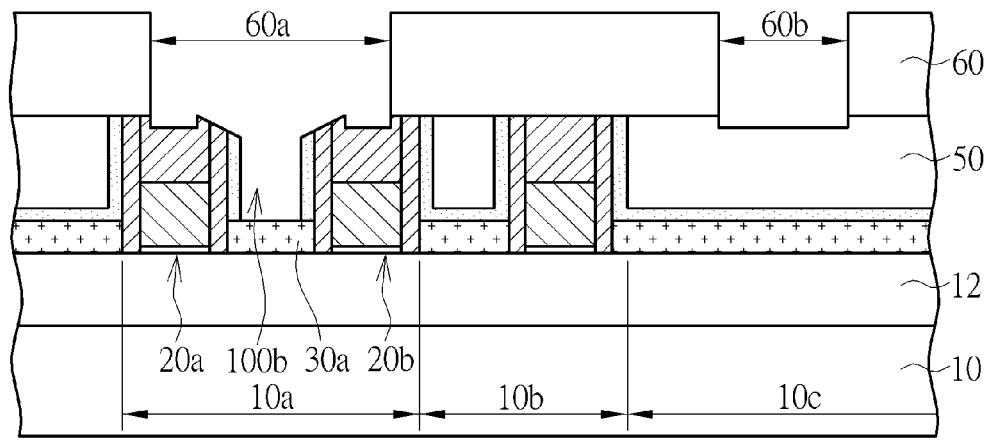

After forming the M0 pattern in the PMD layer 60, please refer to FIG. 7, an ashing process is performed to remove the remained ODL layer, i.e. the 1st portion 72 on the PMD layer 60 and the 2nd portion 74 in the contact trench (FIG. 6), so that a new-defined pattern including an upper M0 pattern 60a and an extending lower self-aligned contact trench 100b in the contact region 10a and a M0 pattern 60b in the isolation region 10c is formed. The self-aligned contact trench 100b exposes the underlying pre-determined source/drain region 30a, so that the contact plug to be formed in following deposition process may be properly land and contact the source/drain region 30a.

Figure 8:
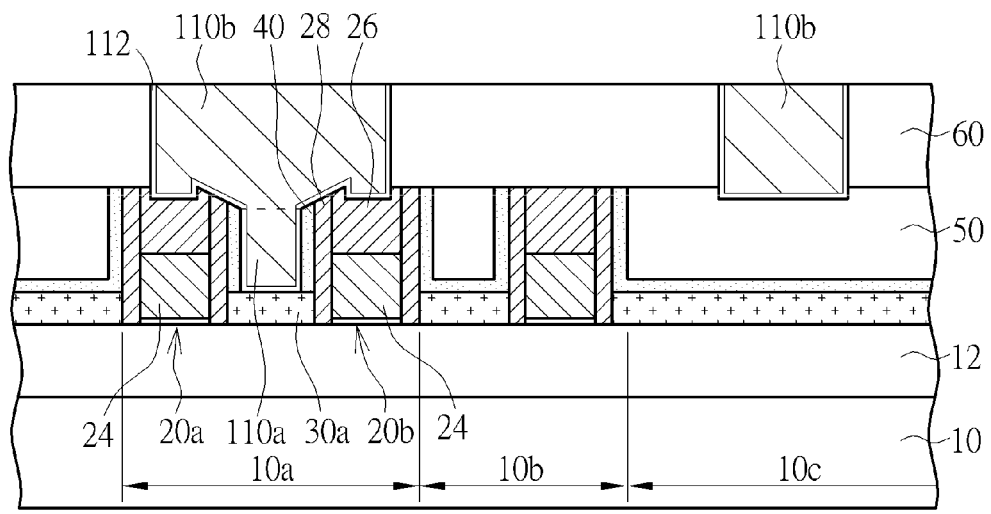

Finally, after defining the M0 pattern in the PMD layer 60, please refer to FIG. 8, a tungsten (W) deposition process is performed to fill up the self-aligned contact trench 100b and the M0 pattern 60a and 60b (FIG. 7), thereby simultaneous forming self-aligned contact (SAC) plug 110a and metal layer (M0 layer) 110b. Before the W deposition, optionally, a barrier layer 112 (ex. Ti, TiN, Ta, or TaN) may be first conformally formed on the self-aligned contact trench 100b and the M0 pattern 60a and 60b. The SAC plug 110a is electrically connected with the underlying source/drain region 30a, and the hard mask 26, the spacers 28 and the CESL layer 40 on top and aside the gate structure 20a and 20b isolate the SAC plug 110a and M0 layer 110b from the gate electrodes 24 to prevent the short circuit between source/drain and gate. In this embodiment, the SAC plug 110a may be considered as an integrated part of the M0 layer 110b extending therefrom. The M0 layer 110b above the contact region 10a electrically connects the SAC plug 110a, while there are still other parts of the M0 layer 110b in other regions, such as the part above the isolation region 10c of the substrate 10. The part in this region may serve as a dummy structure to inhibit the loading effect during the W deposition, or even an individual circuit to connect with other layers.

Figure 9:
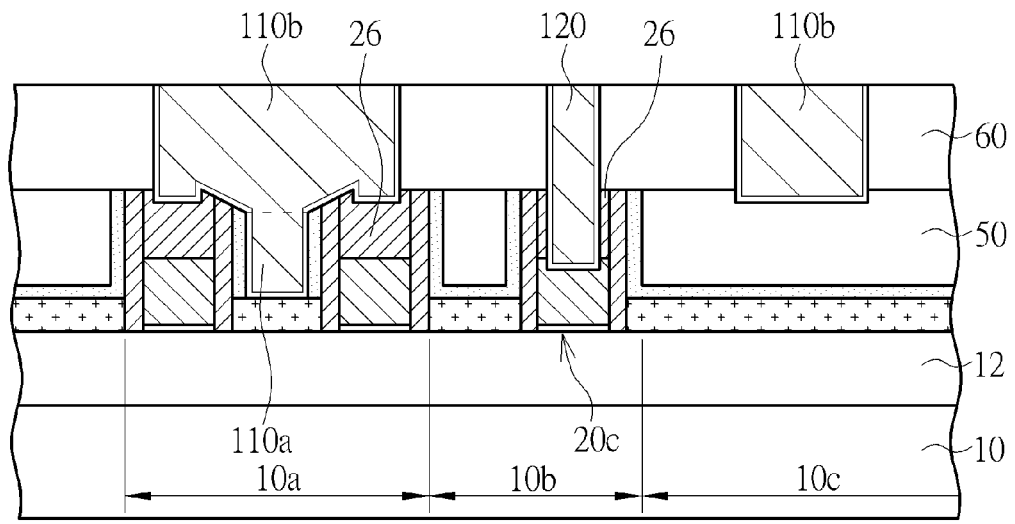

Additionally, in present invention, another contact process may be performed on the non-contact region 10b to form contact structure for connecting the gate structure. As shown in FIG. 9, a contact plug 120 extends through the PMD layer 60 and the hard mask 26 of gate structure 20c to electrically connect the gate electrode 24. This contact plug 120 may be formed by another etch process after the deposition of M0 layer 110b to open a contact hole or trench extending through the PMD layer 60 and reach the underlying gate electrode 24 in the non-contact region 10b. The contact plug 120 for the gate structure, unlike self-aligned contact 110a for the source/drain shown in FIG. 8, may skip the M0 layer 110b to connect the further overlying metal layer (not shown), such as M1 layer.

The advantage of the manufacturing method of present invention is: the self-aligned contact is formed simultaneously with the M0 metal layer in the same deposition process. That is, in addition to the property of excellent self-aligned mechanism, the forming processes of the self-aligned contact and the M0 layer are integrated in the same process flow, thus complex self-aligned contact process flows which have many resistive interfaces and high manufacturing costs may be simplified and still keep on good electrical properties.

According to the above-disclosed method of manufacturing the self-aligned contact and the M0 layer, please refer again to FIG. 8, a semiconductor device with the self-aligned contact is accordingly provided in the present invention, which comprises a substrate 10 with gate structures 20a and 20b formed thereon and a source/drain region 30a formed in the substrate 10 between two gate structures 20a and 20b, a pre-metal dielectric layer on the gate structures 20a and 20b and the substrate 10, and a metal layer 110b formed in the pre-metal dielectric layer 60 with a portion of self-aligned contact 110a extending and electrically connecting to the underlying source/drain region 30a between the two gate structures 20a and 20b.

Figure 10:
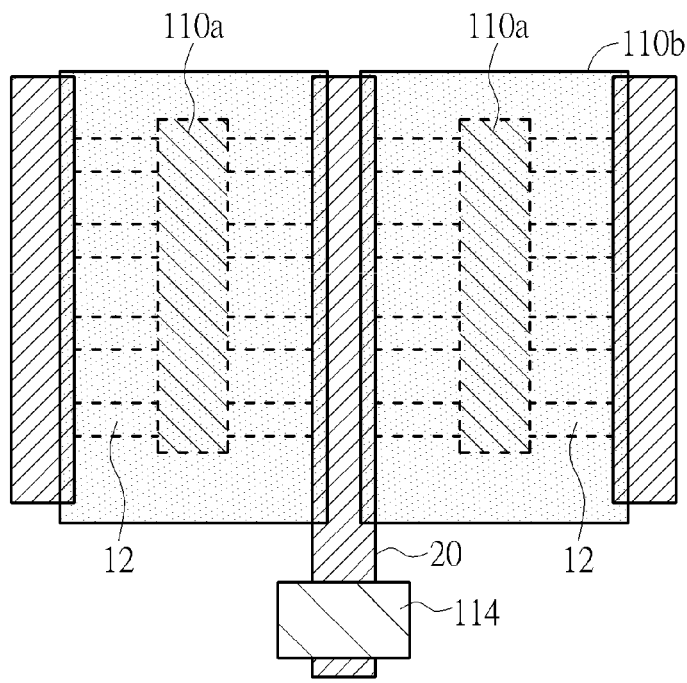
FIG. 10 is a top view schematically illustrating the semiconductor device shown in the contact region of FIG. 9.

FIG. 10 is a top view schematically illustrating the semiconductor device shown in the contact region 10a of FIG. 9. It is clearly shown in FIG. 10 that a plurality of parallel gate structures 20 are disposed traversally across a plurality of parallel fin structures 12. The coverage of the M0 layer 110b (especially the M0 layer on the contact plugs 110a, referred herein as M0_CT layer 110b) extends to and covers a portion of the gate structure 20. The contact plugs 110a contacts the underlying fin structures 12, and a part of the M0_CT layer 110b touches the gate structure 20 but is insulated therefrom by the hard mask layer (26 in FIG. 9) on the gate structure 20. Other metal layer 114 in the same level of the M0 layer 110a may be formed outside the contact region 10a and disposed on a portion of the gate structure 20. Please note that in present invention, the coverages and the positions of the M0_CT layer 110b (i.e. the slot contact) and metal layer 114 are not limited to the pattern and shape shown in FIG. 10. It may be defined and changed by using different masks to obtain desired coverages and position.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device with a self-aligned contact, comprising the steps of:
    providing a substrate with a plurality of gate structures formed thereon;
    forming a 1st dielectric layer on said gate structures and said substrate, wherein said 1st dielectric layer comprises an interlayer dielectric layer and a pre-metal dielectric layer on said gate structures and said interlayer dielectric layer, and a top surface of the interlayer dielectric layer and a top surface of each gate structure are on a same level;
    patterning said 1st dielectric layer to open a self-aligned contact trench between said gate structures and exposing said substrate between said gate structures;
    forming a 2nd dielectric layer on said 1st dielectric layer and in said self-aligned contact trench after the substrate between said gate structures is exposed;
    patterning said 2nd dielectric layer into a 1st portion defining a pattern of metal layer on said pre-metal dielectric layer and a 2nd portion filling in said self-aligned contact trench and positioned under a part of said pattern of metal layer;
    performing an etch process with said 1st portion and said 2nd portion of said 2nd dielectric layer serving as an etch mask to form said pattern of metal layer in said pre-metal dielectric layer;
    removing remaining said 2nd dielectric layer; and
    forming a metal layer with a self-aligned contact simultaneously in said pattern of metal layer in said pre-metal dielectric layer and in said self-aligned contact trench between said gate structures.

2. The method of manufacturing a semiconductor device with a self-aligned contact according to claim 1, wherein the step of patterning said 1st dielectric layer comprises:
    forming a multilayer mask sequentially including an organic dielectric layer, a silicon-containing hard mask bottom anti-reflective layer and a photoresist layer on said 1st dielectric layer, wherein said photoresist layer is provided with an opening between said gate structures; and
    using said multilayer mask as an etch mask to etch said 1st dielectric layer to form said self-aligned contact trench.

3. The method of manufacturing a semiconductor device with a self-aligned contact according to claim 1, wherein the step of patterning said 2nd dielectric layer comprises:
    forming a photoresist layer on said 2nd dielectric layer, wherein said photoresist layer is provided with an opening defining a pattern of a metal layer, and a part of said pattern of a metal layer overlays said self-aligned contact trench and a part of said gate structures; and
    using said photoresist layer as an etch mask to etch said 2nd dielectric layer to form said 1st portion and said 2nd portion.

4. The method of manufacturing a semiconductor device with a self-aligned contact according to claim 1, wherein the step of forming a metal layer with a self-aligned contact simultaneously in said pattern of metal layer comprises:
    forming said metal layer with said self-aligned contact contacting a fin structure on said substrate and with a part of said metal layer disposed on said gate structures.

5. The method of manufacturing a semiconductor device with a self-aligned contact according to claim 1, wherein said metal layer is a M0 layer.

6. The method of manufacturing a semiconductor device with a self-aligned contact according to claim 1, wherein said gate structures are metal gates.

7. The method of manufacturing a semiconductor device with a self-aligned contact according to claim 1, wherein said substrate further comprises fin structures formed thereon, each said gate structure is disposed on said fin structures.

8. The method of manufacturing a semiconductor device with a self-aligned contact according to claim 1, wherein each said gate structure comprises a gate electrode and a hardmask on said gate electrode, and said step of performing said etch process with said 1st portion and said 2nd portion of said 2nd dielectric layer serving as said etch mask consumes a part of said hardmask of each said gate structures.

9. The method of manufacturing a semiconductor device with a self-aligned contact according to claim 1, further comprising forming an epitaxial layer as a top portion of the substrate, and parts of the epitaxial layer are exposed by the self-aligned contact trench.

* * * * *